WIDE BAND HIGH FREQUENCY AMPLIFIER

Filed Nov. 2, 1966 2 Sheets-Sheet 1

Inventor:
MUNI M. MITCHELL
By Eugene M. Whitacre
Attorney

Inventor:
MUNI M. MITCHELL
BY Eugene M. Whitacre
Attorney

United States Patent Office 3,401,349
Patented Sept. 10, 1968

3,401,349

WIDE BAND HIGH FREQUENCY AMPLIFIER

Muni M. Mitchell, Edison, N.J., assignor to Radio Corporation of America, a corporation of Delaware Filed Nov. 2, 1966, Ser. No. 591,509
8 Claims. (Cl. 330—27)

This invention relates to amplifiers and, more particularly, to a radio frequency amplifier using regenerative compensation and employing insulated-gate field-effect semiconductor devices.

In the tuner of a television receiver, for example, it is necessary to amplify and frequency translate a received signal in the frequency range including VHF and UHF. In the VHF range, extending from 54 to 216 megahertz, it is the practice to amplify discrete channels or narrow bands of frequencies. In the UHF range extending from 470 to 890 megahertz, on the other hand, it is the practice to continuously tune the entire band, because of the many channels therein contained. This latter amplification necessitates an amplifier arrangement which will provide broad band gain with good stability and low noise. Prior art vacuum tube and transistor amplifier arrangements, however, have not proved totally suitable for use over this UHF band of frequencies. Hence, their use has been generally limited to the VHF discrete channel service.

It is an object of the present invention, therefore, to provide an amplifier which exhibits good noise and gain performance over the broad band of UHF signal frequencies.

As will become clear hereinafter, one embodiment of such an amplifier includes a cascode circuit using a pair of insulated-gate field-effect transistors. The signal to be amplified is applied between the gate and source electrodes of one transistor of the pair, the drain electrode of which is coupled to the source electrode of the other transistor, with that transistor being connected in a grounded gate configuration. The amplified signal is developed at the drain electrode of the second transistor, which is connected to an output signal circuit. The gate electrode of the second transistor is connected to R.F. ground by means of a suitably proportioned inductive reactance such that a regenerative increase in gain is achieved in the high frequency portion of the UHF band. The gain of the cascode pair over the UHF band is thereby maintained at a high value. Deterioration of noise figure is negligible and, furthermore, reverse feedthrough is reduced in a portion of the band as a consequence of both neutralization of the interelectrode capacitance of the transistors and regenerative feedback cancellation of the inherent degenerative current feedback of the cascode circuit.

The novel features of this invention will become apparent from the following description when read in conjunction with the accompanying drawings in which.

Figure 1:
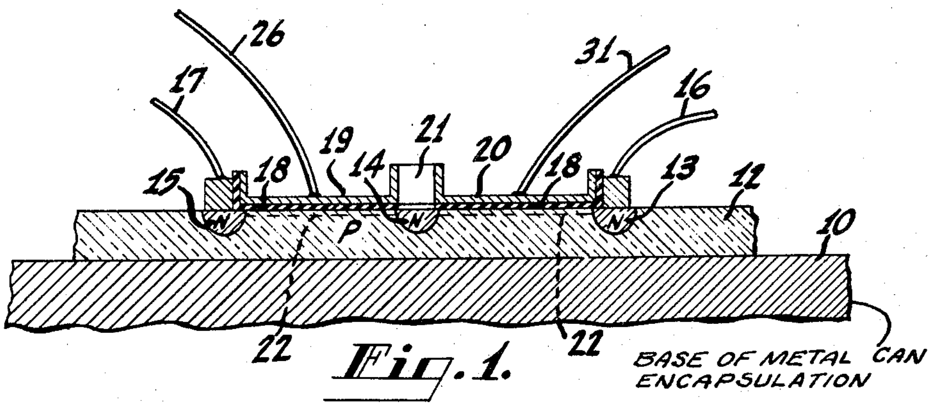
FIGURE 1 is a cross-sectional view of a dual gate insulated-gate field-effect transistor.

Referring now to FIGURE 1, the cross-sectional view of the illustrated dual gate insulated-gate field-effect transistor shows a header 10 which is typically the base of a metal can encapsulation. Mounted on this header 10 is a substrate of semiconductor material 12 which may be nearly intrinsic P-type silicon of a 10–20 ohm-cm. doping. In the manufacture of the transistor three regions 13, 14 and 15 of high N-type doping are provided and respectively become the drain, the combined source-drain, and the source regions of the dual gate transistor. Connection leads 16 and 17 are provided to connect the drain and source regions 13 and 15 to the terminals of the encapsulation not shown. An insulating film of silicon dioxide 18 is formed over the substrate surface extending from the source region 15 to the drain region 13. Over this film 18 are provided the two metal gate electrodes 19 and 20 which are separated by an insulating spacer 21 to reduce the capacitance between these electrodes.

In detail, the metal gate electrode 19 is formed so as to overlap the semiconductor substrate 12 between the source and source-drain regions 15 and 14, while the gate electrode 20 is formed so as to overlap the substrate 12 between the source-drain and drain regions 14 and 13. The source, source-drain, and drain regions 15, 14, 13 are made of an N-type doping and the substrate 12 is of a P-type doping, as was previously mentioned. When an operating voltage is applied which places the source region 15 at a negative potential with respect to that at the drain region 13, a voltage distribution occurs which results in a depletion region being formed adjacent to the drain 13. This permits a uniform very low voltage gradient to be developed across the remainder of the substrate 12. The resulting uniform potential across the entire substrate 12 then permits both gate electrodes 19 and 20 to be biased through connecting leads 26 and 31 with a voltage referenced to the source 15 since the substrate 12 and the source 15 are at substantially the same potential.

The principal conduction between the source 15 and the drain 13 is via a layer of charge 22 present at the surface of the semiconductor substrate 12 and adjacent to the silicon dioxide film 18. This layer of charge 22 is induced by the application of a control potential to the metal gate electrodes 19 and 20 by means of the leads 26 and 31. Therefore, input signals and bias voltages applied to the gate electrodes 19 and 20 can directly control the thickness and density of the induced charge layer 22 and the resultant current flow between the source and drain regions 15 and 13.

It will be appreciated that the dual gate transistor of FIGURE 1 can be considered as being a pair of transistors having their current paths serially connected. Region 14, for example, can serve both as the drain region for one insulated gate transistor having its source region represented by the numeral 15, and also, as the source region for the other insulated gate transistor whose drain region is represented by the number 13. As constructed, however, the dual gate transistor is a single integrated unit enclosed by a metal encapsulation.

Figure 2:
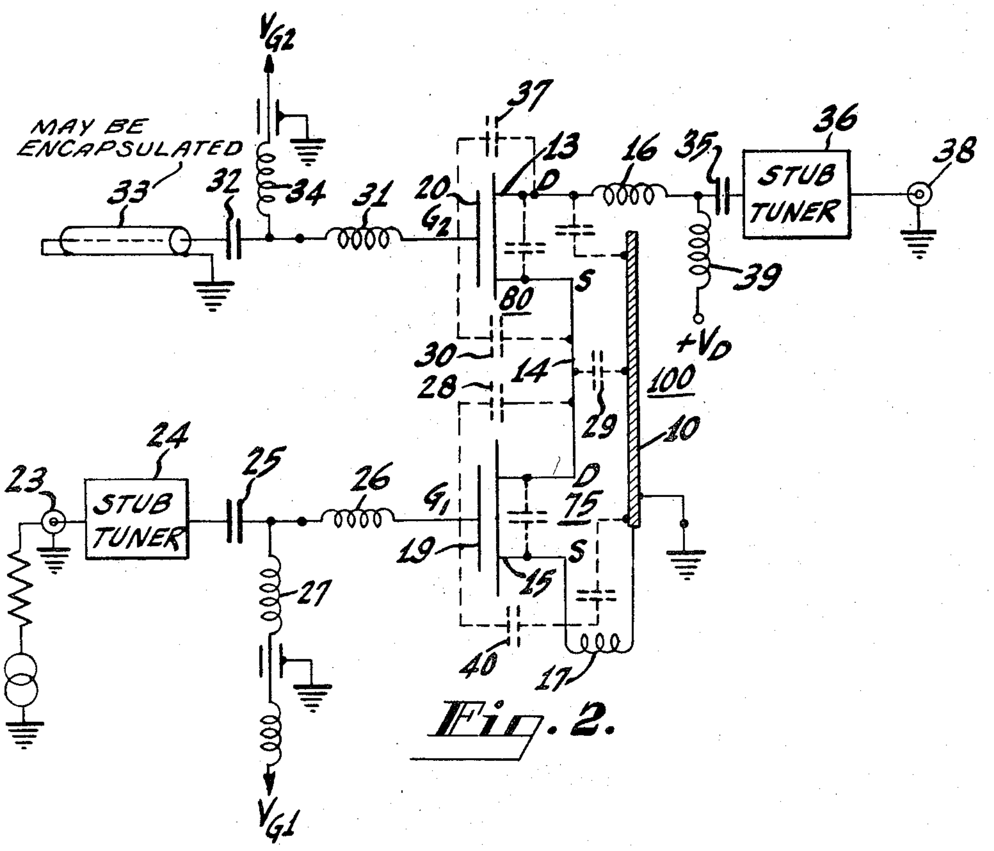
FIGURE 2 is a schematic circuit diagram of an amplifier arrangement embodying the invention and utilizing the dual gate field effect transistor shown in FIGURE 1.

Referring now to FIGURE 2, there is shown a schematic circuit diagram of an amplifier arrangement embodying the invention and particularly useful at UHF frequencies. Corresponding numbers are used in FIGURE 2 to identify similar component elements as are used in the dual-gate insulated-gate field-effect transistor illustration of FIGURE 1. An input signal terminal 23 is shown in FIGURE 2 and couples the signal to be amplified to a broad band stub tuning circuit 24. Circuit 24 is selected to be of a type which will translate the signal frequency band of interest. The translated input signal is coupled to the gate electrode 19 of an integrated dual gate field effect transistor 100 of the type shown in FIGURE 1 by means of a coupling capacitor 25 and the inherent inductance of lead 26. A bias potential is also coupled to the gate electrode 19, from a supply $V_{G1}$ via an isolation inductance 27 connected to the junction of capacitor 25 and lead inductance 26. The connecting lead 17 connects the source electrode 15 of transistor 100 to an adjacent point on the metal header 10. The header 10 is shown coupled to a point of reference or ground potential outside the metal case encapsulation, so that the connecting lead 17 forms a low inductance signal path from the source electrode 15 to ground. The capacitance of the input gate electrode 19 to the source electrode 15 is represented in FIGURE 2 by a dashed capacitor 40. The capacitance of the gate electrode 19 to the source-drain region 14 is further represented by a dashed capacitor 28.

A signal derived from the stub tuning circuit 24 appears across the gate-to-source capacitance 40 in a slightly attenuated form due to the combined effects of the gate connecting lead inductance 26 and the source connecting lead inductance 17. This signal is amplified by the lower insulated-gate transistor 75 and appears in amplified form between the source-drain region 14 and ground. The stray capacitance between the source-drain region 14 and ground is represented by another dashed capacitor 29.

The gate electrode 20 of the upper insulated-gate field-effect transistor 80 of the integrated dual gate pair is connected to ground potential via the inherent inductance of gate connecting lead 31, a direct current isolating capacitor 32, and an inductive reactance stub 33 all being serially connected. The drain electrode 13 of the upper transistor 80 is coupled to an output terminal 38 by means of a drain connecting lead 16, which also exhibits an inherent inductance, a coupling capacitor 35, and a stub tuner circuit 36. The stub tuner 36 is continuously tunable over the UHF band and is typically in ganged connection with the input stub tuner 24. A radio frequency choke coil 39 is provided to couple an operating voltage supply $+V_D$ to the drain electrode 13 and is connected to the junction of the lead 16 and the capacitor 35. The capacitance of the gate electrode 20 to the source-drain region 14 is represented by the capacitor 30. A bias potential is coupled to the gate electrode 20 from a supply $V_{G2}$ via an isolating inductance 34 connected to the junction of lead inductance 31 and capacitor 32.

The amplified signal which appears between the source-drain region 14 and ground due to the action of the lower insulated-gate field-effect transistor 75 also appears across the input circuit of the upper transistor 80, i.e., across the series connection of the gate-source capacitance 30, the gate lead inductance 31, the coupling capacitor 32, and the inductance stub 33. This signal is amplified further by the upper insulated-gate field-effect transistor 80 and appears as such at the drain electrode 13.

A portion of this latter amplified signal is coupled back from the drain electrode 13 to the gate electrode 20 by means of a gate-to-drain interelectrode capacitance 37. This feedback signal causes an increase in the overall signal gain provided by the integrated dual gate transistor 100.

Regenerative feedback to the gate electrode 20 of the upper insulated-gate field-effect transistor 80 increases the input impedance at the source-drain region 14. Because the stray capacitance 29 existent between this combination region 14 and the grounded metal header 10 is extremely small, the signal gain provided by the upper transistor 80 is not limited at this point by capacitance loading. It is a feature of the integrated dual gate transistor 100 that the capacitance to ground of the combined drain electrode of the lower transistor 75 and source electrode of the upper transistor 80 is reduced to a value far less than the total capacitance to ground would be if these electrodes were considered component parts of the two discrete insulated-gate field-effect transistors.

The signal gain provided by the lower transistor 75 of the integrated pair is limited by the impedance at the source-drain region 14. The regenerative feedback between the drain electrode 13 and the gate electrode 20, however, cancels the degenerative feedback of the total transistor current and thereby raises this impedance. As a result, the gain of the lower transistor 75 is increased. Because there is an increase in gain in both stages by virtue of this regenerative feedback, only a small amount is required to significantly increase the overall gain. In this way the stability of amplifier operation is retained while the forward gain provided is increased.

Besides providing improved broad band signal gain, another feature of the amplifier arrangement of FIGURE 2 is the neutralization of interelectrode capacitance feedback. The drain electrode 13 of the upper transistor of the integrated dual gate pair 80 and the gate electrode 19 of the lower transistor of the pair 75 have disposed between them an array of stray capacitances and interelectrode capacitances, including the termination of some of these capacitances in the ground lead to the gate electrode 20. Any such array between three terminals may be reduced to an equivalent three capacitor T configuration. In such an equivalent T configuration the capacitance of the leg connected to the ground terminal is of interest. That capacitance in series with an appropriate inductance to ground will resonate at a frequency within the translated band of frequencies and will provide a low impedance path to ground from the center connection of the T. At that frequency, however, reverse feedback through the interelectrode capacitances is neutralized by the presence of the inductance in the ground lead to the gate electrode 20. Experience with the integrated dual gate field effect transistor has shown that there is a significant band of frequencies where this neutralization provides effective reduction of reverse feedback to the gate electrode 19.

Figure 3A:
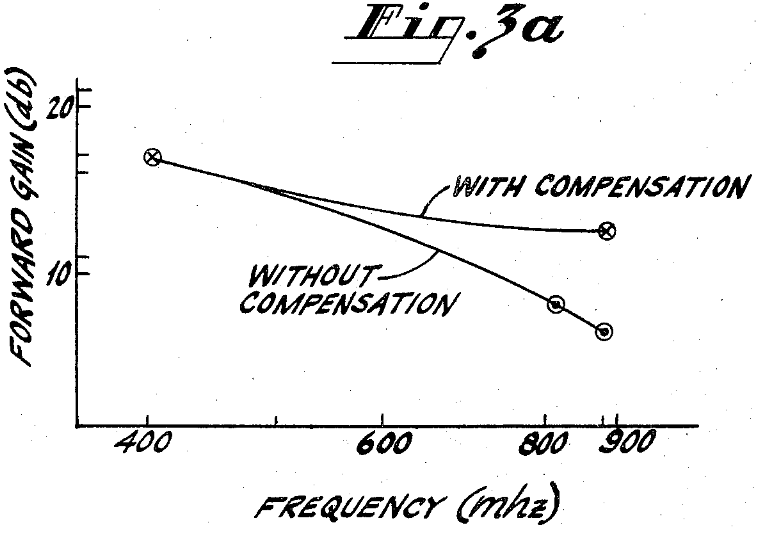
FIGURES 3A and 3B are graphs illustrating the forward gain and reverse attenuation characteristics provided by the amplifier embodiment of FIGURE 2.
Figure 3B:
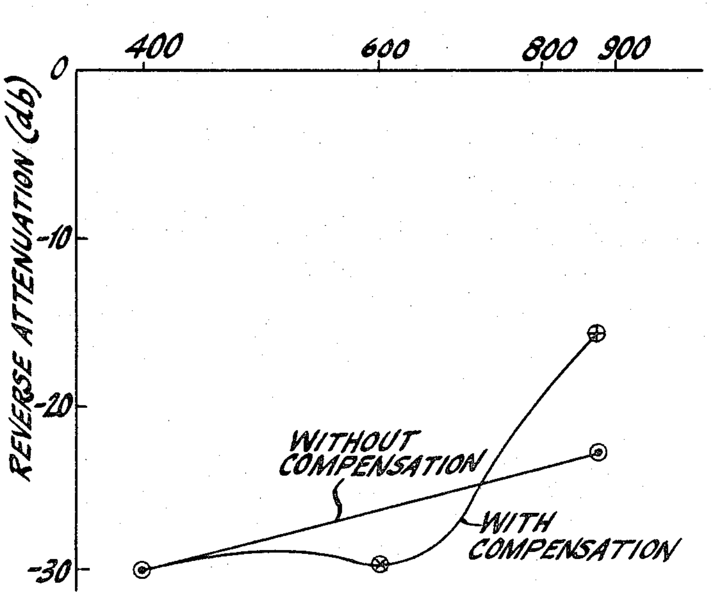

FIGURE 3A is a graph showing the forward gain characteristic of the amplifier of FIGURE 2 as a function of frequency with and without regenerative compensation. FIGURE 3B is a graph showing the reverse attenuation characteristic presented by the amplifier of FIGURE 2 to a signal at the drain electrode 13 and preventing it from appearing at the gate electrode 19, under the same frequency and compensation conditions. As shown in FIGURE 3A, the forward gain with regenerative compensation changes by only some 4 db over the entire band of UHF frequencies, while without regenerative compensation, the variation is over 10 db. As shown, in FIGURE 3B, the reverse attenuation is improved in a part of the band as a result of the neutralization of interelectrode capacitance feedback and the simultaneous cancellation of the degenerative current feedback. It can be seen that the reverse attenuation is improved in a significant fractional part of the UHF band while the forward gain is increased.

Reverse attenuation of a radio frequency amplifier provides a means for attenuating the oscillator injection signals of the mixer stage which appear at the amplifier output. As used in a UHF tuner for a television receiver, for example, the integrated dual gate transistor amplifier of FIGURE 2 can be used to amplify the received signal before application to a mixer circuit for frequency translation down to an intermediate frequency. Such a mixer circuit might typically use a crystal diode, as is the current practice. The oscillator injection signal supplied to the crystal mixer will then also appear at the output of the integrated insulated gate amplifier. Attenuation of the reverse feedthrough of the oscillator signal prevents it from appearing at the antenna terminals and thereby being radiated by the receiving antenna. Though there are well-known means for minimizing such oscillator-injection radiation, the 20–30 db of additional isolation provided by the amplifier of FIGURE 2 would significantly reduce interference from any radiation which may still exist.

For UHF amplification the required compensation inductance may be a very short length of wire or coaxial stub. These high frequencies and short wave lengths make the length of the gate connecting lead 31 a significant part of the correct compensation inductance. It has been found that the most reproducible connection for the gate connecting lead 31 is a direct, short connection to ground at the metal header 10. Since an additional, very short wire would represent the inductance required for proper compensation, a coil placed inside the device encapsulation as a part of the dual gate transistor would provide proper compensation. Such a configuration would have the advantage of high reproducibility. A further refinement would include adjustment of the device fabrication such that the proper bias for the gate electrode 20 would be zero volts with respect to the source electrode 15. The gate lead 31 could then be connected directly to ground without the coupling capacitor 32 or the necessity of a bias supply.

What is claimed is:

1. A wideband amplifier comprising:
- first and second field effect transistors, each having gate, source and drain electrodes formed on a substrate of semiconductor material;
- an input signal circuit coupled between the gate and source electrodes of said first transistor;
- first means connecting the source electrode of said first transistor to a point of reference potential;
- second means coupling the drain electrode of said first transistor to the source electrode of said second transistor;
- an output signal circuit coupled between the drain electrode of said second transistor and said point of reference potential;
- and third means connecting the gate electrode of said second transistor to said point of reference potential, said third means including an inductive reactance for neutralizing interelectrode capacitance of said second transistor over a first fractional part of a wideband spectrum of frequencies and for providing a regenerative increase in the forward gain of said first and second transistors over a second fractional part of said wideband frequency spectrum.

2. A wideband amplifier as defined in claim 1 wherein said first and second field effect transistors additionally have their respective gate electrodes insulated from their respective substrates.

3. A wideband amplifier as defined in claim 2 wherein said second means direct current connects the drain electrode of said first transistor to the source electrode of said second transistor.

4. A wideband amplifier as defined in claim 2 wherein said third means provides a regenerative increase in the forward gain of said first and second transistors over a second, larger fractional part of said wideband frequency spectrum.

5. A wideband amplifier as defined in claim 2 wherein said third means provides a regenerative increase in the forward gain of said first and second transistors over a second fractional part of said wideband frequency spectrum which includes said first fractional part of said spectrum.

6. A wideband amplifier as defined in claim 2 wherein said first and second field effect transistors are constructed on a single substrate of semiconductor material and mounted in a single encapsulation.

7. A wideband amplifier as defined in claim 6 wherein said inductive reactance includes the inductive reactance exhibited by a connecting lead in series with an inductance element, the two being connected between the gate electrode of said second transistor and said point of reference potential.

8. A wideband amplifier as defined in claim 7 wherein said inductance element is included within said single encapsulation.

References Cited

UNITED STATES PATENTS 2,795,655 6/1957 Scandurra et al. ------ 330—78

ROY LAKE, *Primary Examiner.*

J. B. MULLINS, *Assistant Examiner.*